US012748355B2

(12) United States Patent
Han et al.

(10) Patent No.: US 12,748,355 B2
(45) Date of Patent: Sep. 29, 2026

(54) STORAGE AND TRANSFER MODULE AND SUBSTRATE TREATMENT APPARATUS INCLUDING STORAGE AND TRANSFER MODULE

(71) Applicant: SEMES CO., LTD., Cheonan-si (KR)

(72) Inventors: Ki Won Han, Anseong-si (KR); Doo Hyun Baek, Hwaseong-si (KR); Hee Chan Kim, Hwaseong-si (KR); Tae Kyung Kong, Cheonan-si (KR); Dong Kyum Kim, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 100 days.

(21) Appl. No.: 18/884,071

(22) Filed: Sep. 12, 2024

(65) Prior Publication Data

US 2025/0164898 A1 May 22, 2025

(30) Foreign Application Priority Data

Nov. 16, 2023 (KR) ........................ 10-2023-0158967

(51) Int. Cl.
*G03F 7/00* (2006.01)
*G03F 7/16* (2006.01)
*H10P 72/00* (2026.01)

(52) U.S. Cl.
CPC ............ *G03F 7/70808* (2013.01); *G03F 7/16* (2013.01); *G03F 7/7075* (2013.01);
(Continued)

(58) Field of Classification Search
CPC ...... G03F 7/70808; G03F 7/16; G03F 7/7075; H10P 72/0448; H10P 72/0454;
(Continued)

(56) References Cited

U.S. PATENT DOCUMENTS 6,402,400 B1 * 6/2002 Ueda ................... H10P 72/0452 29/25.01
7,665,415 B2 * 2/2010 Nishimura .......... H10P 72/0618 118/712

(Continued)

FOREIGN PATENT DOCUMENTS

JP 2001-118782 4/2001
KR 10-2015-0041587 4/2015

(Continued)

OTHER PUBLICATIONS

Office Action dated Dec. 10, 2024 for Korean Patent Application No. 10-2023-0158967 and its English translation by Google Translate.

*Primary Examiner* — Steven H Whitesell
(74) *Attorney, Agent, or Firm* — WOMBLE BOND DICKINSON (US) LLP

(57) ABSTRACT

A storage and transfer module includes a module body, a storage and transfer unit disposed in the module body, the storage and transfer unit including a liftable transfer portion, and a storage portion disposed on the outside of the transfer portion, the storage portion having a storage space therein, and a transfer target portion in which a substrate is transferred by the transfer portion. A pair of the storage and transfer units are provided. The pair of storage and transfer units are disposed to oppose each other with the transfer target portion interposed therebetween. A substrate loading portion is disposed on one side of the storage and transfer units.

13 Claims, 9 Drawing Sheets

(52) U.S. Cl.
CPC ...... *H10P 72/0448* (2026.01); *H10P 72/0458* (2026.01); *H10P 72/0461* (2026.01); *H10P 72/0474* (2026.01)

(58) Field of Classification Search
CPC ............. H10P 72/0458; H10P 72/0474; H10P 72/0466; H10P 72/0464; H10P 72/0462; H10P 72/0461; H10P 72/0452; H10P 72/0451; H10P 72/0431; H10P 72/0432; H10P 72/0434; H10P 72/0436; H10P 72/0468
See application file for complete search history.

(56) References Cited

U.S. PATENT DOCUMENTS

2013/0078059 A1* 3/2013 Enokida .............. H10P 72/0458 414/806
2015/0078870 A1* 3/2015 Dauendorffer ......... B65D 47/04 222/189.1
2015/0096682 A1* 4/2015 Nakashima ............. G03F 7/162 414/217
2015/0214081 A1 7/2015 Kikuchi
2020/0211880 A1 7/2020 Kuwahara
2020/0357630 A1* 11/2020 Hashimoto ......... H10P 72/0402
2022/0165597 A1* 5/2022 Watanabe ........... H10P 72/0458
2023/0106927 A1* 4/2023 Watanabe ............ B65G 1/0407 414/277
2024/0094644 A1* 3/2024 Ogata ................. G03F 7/70808
2024/0152052 A1* 5/2024 Tanaka ....................... G03F 7/16

FOREIGN PATENT DOCUMENTS

KR 10-2015-0089947 8/2015
KR 10-2020-0083236 7/2020
KR 10-2022-0072762 6/2022

* cited by examiner

STORAGE AND TRANSFER MODULE AND SUBSTRATE TREATMENT APPARATUS INCLUDING STORAGE AND TRANSFER MODULE

CROSS-REFERENCE TO RELATED APPLICATION(S)

This application claims benefit of priority to Korean Patent Application No. 10-2023-0158967 filed on Nov. 16, 2023 in the Korean Intellectual Property Office, the disclosure of which is incorporated herein by reference in its entirety.

BACKGROUND

1. Field

The present disclosure relates to a storage and transfer module and a substrate treatment apparatus including the same.

2. Description of Related Art

In a photoresist process, one of the semiconductor manufacturing processes, a resist may be coated on a surface of a semiconductor wafer (hereinafter, referred to as a wafer), a substrate, exposed to have a predetermined pattern, and developed to form a resist pattern. Such a treatment may be performed using a system in which an exposure apparatus is connected to a coating and development apparatus (a substrate treatment apparatus) for coating and development a resist.

The coating and development apparatus may sequentially supply various chemical liquids (treatment liquids) to the wafer using a liquid treatment module, and may execute various treatments according to the photoresist process, such as a resist coating treatment and a development treatment. As a result, the substrate treatment apparatus may have an accommodation region in which a chemical liquid container in which each chemical liquid is stored, and the chemical liquid may be supplied from the accommodation region to each liquid treatment module.

In general, the accommodation region of the chemical container may be provided in a lower portion of an equipment front end module (EFEM). In this case, a wafer conveying robot is installed in an upper portion of the accommodation region, and thus a height of the accommodation region is limited. In addition, as multiple manufacturing facilities may be installed in a limited space of a semiconductor line, the manufacturing facilities may be disposed at a significantly narrow interval of about 800 to 900 mm, and thus a length of the accommodation space may be limited. Due to limitations such as a design of the accommodation region and installation of the manufacturing facilities, there is a limitation in that only a limited number (about 12) of chemical containers are stored in a current accommodation space. As a result, frequent replenishment operations of chemical containers may be required, resulting in a decline in wafer production.

PRIOR ART DOCUMENT

Patent Document

Patent Document 1: Korean Patent No. 10-2245902 (Apr. 23, 2021)

SUMMARY

Aspects of the present disclosure provide a storage and transfer module having a compact structure while securing a space to accommodate a large number of chemical liquid (treatment liquid) containers, and a substrate treatment apparatus including the same.

According to an aspect of the present disclosure, there is provided a storage and transfer module including a module body, a storage and transfer unit disposed in the module body, the storage and transfer unit including a liftable transfer portion, and a storage portion disposed on the outside of the transfer portion, the storage portion having a storage space therein, and a transfer target portion in which a substrate is transferred by the transfer portion. A pair of the storage and transfer units may be provided. The pair of storage and transfer units may be disposed to oppose each other with the transfer target portion interposed therebetween. A substrate loading portion may be disposed on one side of the storage and transfer units.

According to another aspect of the present disclosure, there is provided a substrate treatment apparatus including a loading port including a substrate loading portion in which a substrate is disposed, a buffer module including a frame and a plurality of buffers disposed in the frame, the plurality of buffers arranged in a vertical direction, and a storage and transfer module including a module body, a storage and transfer unit disposed in the module body, the storage and transfer unit including a liftable transfer portion, and a storage portion disposed on the outside of the transfer portion, the storage portion having a storage space therein, and a transfer target portion in which a substrate is transferred by the transfer portion. A pair of storage and transfer units may be provided and disposed to oppose each other with the transfer target portion interposed therebetween. The substrate loading portion may be disposed on one side of the storage and transfer units.

According to another aspect of the present disclosure, there is provided a substrate treatment apparatus including a loading port including a cassette in which a substrate is accommodated, and a plurality of mounting tables on which the cassette is loaded, a heat treatment chamber portion including a baking chamber and a plurality of heating plates disposed in the baking chamber, the plurality of heating plates stacked in a vertical direction, a buffer module including a frame and a plurality of buffers disposed in the frame, the plurality of buffers arranged in the vertical direction, and a storage and transfer module including a module body, a storage and transfer unit disposed in the module body, the storage and transfer unit including a liftable transfer portion, and a storage portion having a storage space therein, the storage and transfer unit in which a partition wall disposed between the transfer portion and the storage portion, and a transfer target portion in which the substrate is transferred by the transfer portion. A pair of storage and transfer units may be provided and disposed to oppose each other with the transfer target portion interposed therebetween, and a plurality of mounting tables may be disposed on one side of each of the pair of storage and transfer units. The plurality of mounting tables may respectively oppose the pair of storage and transfer units, and may be disposed in a row in the vertical direction. In the storage space, a plurality of support plates may be disposed in multiple stages in the vertical direction, and at least one treatment liquid container may be supported on each of the support plates. One of the buffer module and the heat treatment chamber portion may be selectively disposed in the transfer target portion.

In a storage and transfer module and a substrate treatment apparatus including the same according to example embodiments of the present disclosure, another module of the substrate treatment apparatus, such as a buffer module, a substrate inspection module, or a heat treatment chamber may be disposed in a transfer target portion, a region between transfer portions opposing each other, thereby optimizing a conveyance path of a substrate and allowing the substrate treatment apparatus to have a compact structure. In addition, a storage portion having a multistage accommodation structure may be disposed in a vertical direction at opposite outer ends of the transfer portions, opposing each other. As a result, multiple treatment liquid containers may be stored in a stacked manner to reduce time required to replenish the treatment liquid containers, thereby improving productivity of the substrate treatment apparatus.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
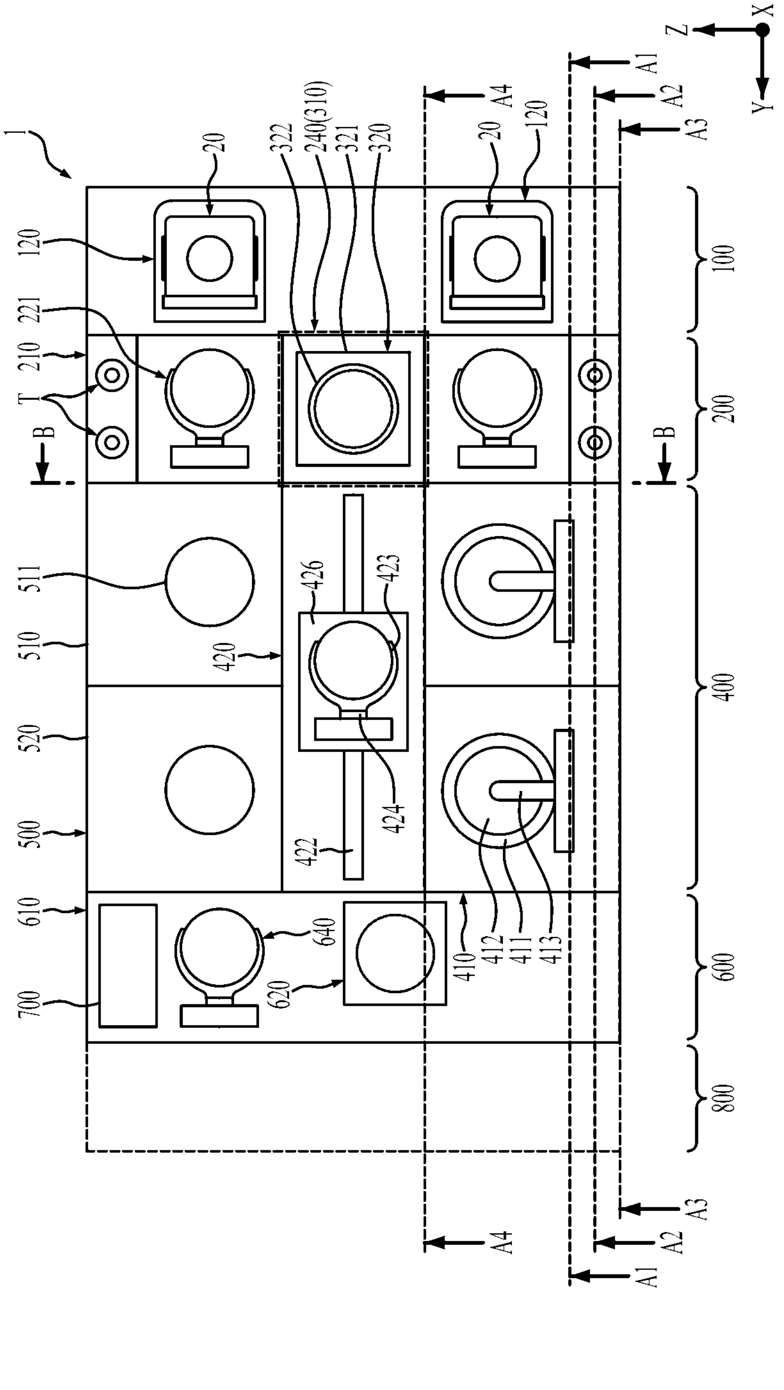
FIG. 1 is a top view of a substrate treatment apparatus according to an example embodiment of the present disclosure.

Hereinafter, preferred example embodiments will be described in detail, such that the disclosure could be easily carried out. In describing example embodiments of the present disclosure, when it is determined that a detailed description of a known technology related to the present disclosure may unnecessarily obscure the gist of the present disclosure, a detailed description thereof will be omitted. In addition, the same reference numerals are used throughout the drawings with respect to components having similar functions and actions. In addition, in the present specification, terms such as "upper," "upper portion," "upper surface," "lower," "lower portion," "lower surface," and "side surface" are based on the drawings, may vary depending on a direction in which an element or component is actually arranged.

In addition, it will be understood that "comprises" and/or "comprising" specify the presence of stated features, integers, steps, operations, elements, components or a combination thereof, but do not preclude the presence or addition of one or more other features, integers, steps, operations, elements, components, and/or groups thereof.

Figure 2:
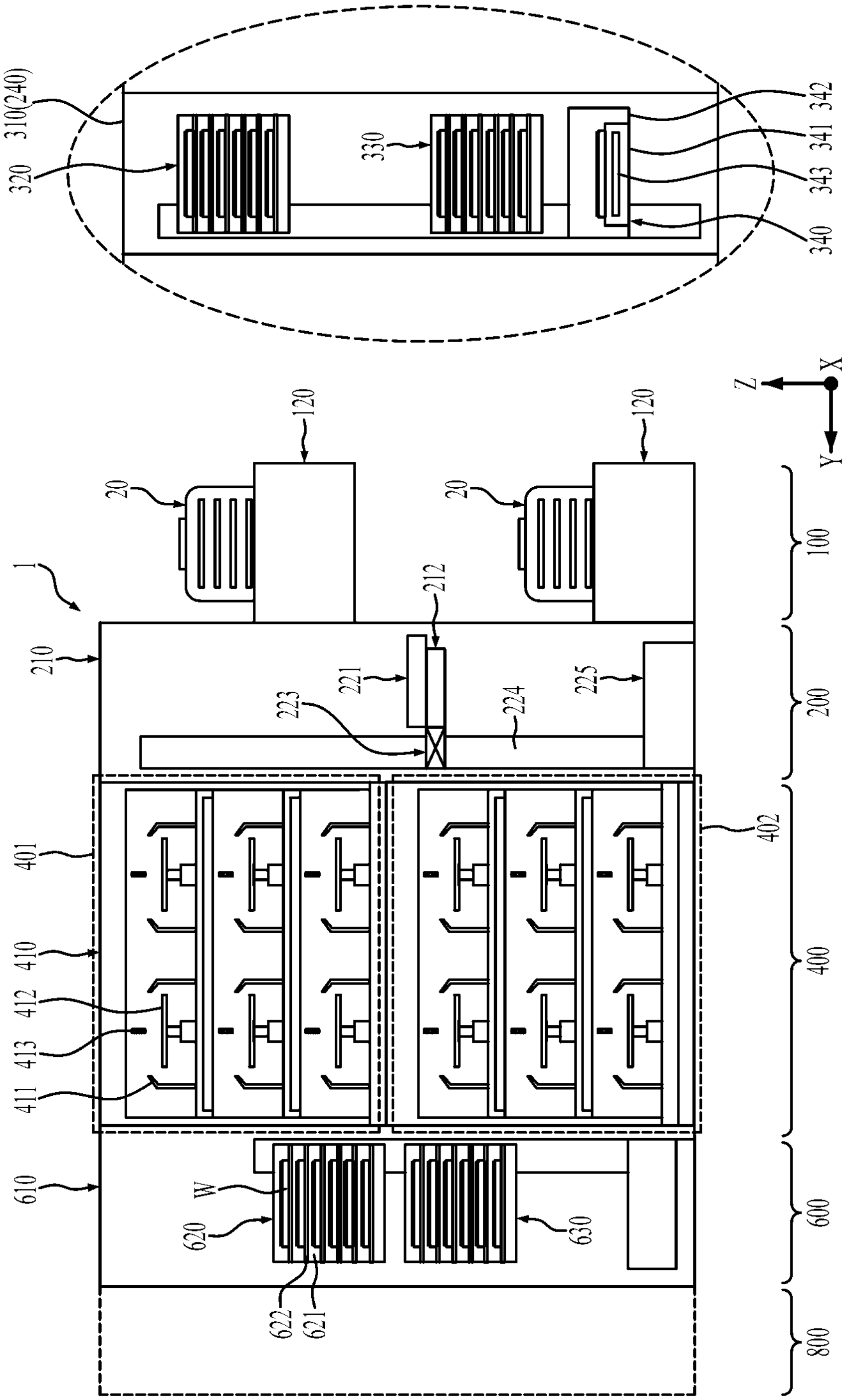
FIG. 2 is a view of the substrate treatment apparatus of FIG. 1 in a direction of A1-A1.
Figure 3:
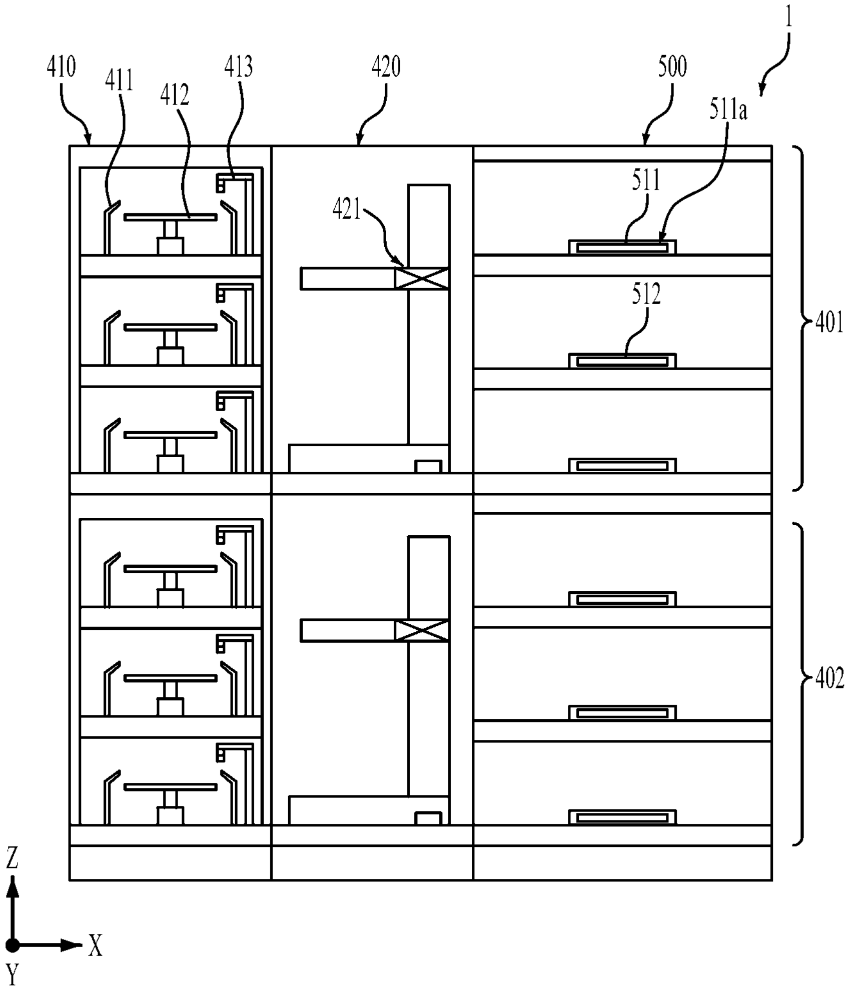
FIG. 3 is a view of the substrate treatment apparatus of FIG. 1 in a direction of B-B.

FIG. 1 is a top view of a substrate treatment apparatus according to an example embodiment of the present disclosure. FIG. 2 is a view of the substrate treatment apparatus of FIG. 1 in a direction of A1-A1. FIG. 3 is a view of the substrate treatment apparatus of FIG. 1 in a direction of B-B.

Referring to FIGS. 1 to 3, a substrate treatment apparatus 1 may include a loading port 100, a storage and transfer module 200, a buffer module 300, a coating and development module 400, a heat treatment chamber portion 500, and a purge module 700. In this case, the loading port 100, the storage and transfer module 200, the coating and development module 400, and the interface module 600 may be sequentially disposed in a row in one direction. The purge module 700 may be provided in the interface module 600.

Alternatively, the purge module 700 may be provided at various positions such as a position to which an exposure device 800 of a rear end of the interface module 600 is connected, or a side portion of the interface module 600. In addition, one of the buffer module 300 and the heat treatment chamber portion 500 may be disposed in the storage and transfer module 200, which will be described below.

Hereinafter, a direction in which the loading port 100, the storage and transfer module 200, the coating and development module 400, and the interface module 600 are disposed may be referred to as a first direction Y, a direction, perpendicular to the first direction Y may be referred to as a second direction X, and a direction, perpendicular to each of the first direction Y and the second direction X may be referred to as a third direction Z.

The substrate W may be moved in a state of being accommodated in a cassette 20. The cassette 20 may be sealed from the outside. For example, a front-opening integrated pod (FOUP), having a door in front thereof, may be used as the cassette 20.

Hereinafter, the loading port 100, the storage and transfer module 200, the buffer module 300, the coating and development module 400, the interface module 600, and the purge module 700 will be described in detail.

The loading port 100 may include a substrate loading portion. The substrate loading portion may include at least two mounting tables 120 on which the cassette 20 in which the substrate W is accommodated is disposed. A plurality of mounting tables 120 may be provided, and details of an arrangement of the mounting tables 120 will be described below.

The storage and transfer module 200 may transfer the substrate W, between the cassette 20 disposed on the mounting table 120 of the loading port 100 and the buffer module 300. In addition, the storage and transfer module 200 may store a treatment liquid container T in which a treatment liquid used in a process of treating the substrate W is stored. In this case, the storage and transfer module 200 may include a module body 210, a transfer portion 220, a storage portion 230, and a transfer target portion 240. Hereinafter, the transfer portion 220 and the storage portion 230 will be collectively referred to as a storage and transfer unit U.

The module body 210 may be formed by connecting a plurality of frames to each other. For example, the module body 210 may be formed by connecting the plurality of frames, and may have a rectangular parallelepiped shape having an empty space therein. In this case, the module body 210 may have a height, lower than that of the frame 310 of the buffer module 300.

The transfer portion 220 may be disposed in the module body 210. A hand portion 221, a horizontal transfer portion 222, a vertical transfer portion 223, a guide portion 224, and a support 225 may be included. In this case, the support 225 may be fixedly installed on a bottom surface of the module body 210, and the guide portion 224 may be connected to an upper surface of the support 225 to extend in the third direction Z. One surface of the guide portion 224 may include a first guide rail (not illustrated) extending in a third direction Z, and the vertical transfer portion 223 may be connected to the first guide rail in a liftable manner. In addition, the vertical transfer portion 223 capable of reciprocating or expanding in the second direction Y may be connected to the vertical transfer portion 223. The hand portion 221 may be rotatably connected to the horizontal transfer portion 222.

The hand portion 221 may be configured as, for example, a robot hand capable of directly gripping and handling the substrate W. With a coupling structure as described above, the hand portion 221 may lift in the third direction Z, or may rotate about a rotating shaft in a state of being supported by the support 225. In addition, the hand portion 221 may move toward or away from another module (for example, the substrate inspection module, the buffer module, or the heat treatment chamber portion) of the substrate treatment apparatus 1 by rotating so as to be oriented in one direction and then linearly reciprocating together with the horizontal transfer portion 222. Although not illustrated in the drawings, the module body 210 may further include a door opener (not illustrated), opening and closing a door of the cassette 20.

Features of the storage portion 230 and the transfer target portion 240, and an arrangement relationship with the transfer portion 220 will be described below.

The right drawing of FIG. 2 is a view of the substrate treatment apparatus in a direction of A4-A4 of FIG. 1, and the buffer module 300 may include a frame 310, a first buffer 320, a second buffer 330, and a cooling chamber 340. The frame 310 may have a rectangular parallelepiped shape having an empty space therein. As described above, the buffer module 300 may be disposed in the storage and transfer module 200. However, the present disclosure is not limited thereto, and the buffer module 300 may be disposed between the storage and transfer module 200 and the coating and development module 400, which will be described below.

The first buffer 320, the second buffer 330, and the cooling chamber 340 may be positioned in the frame 310. The cooling chamber 340, the second buffer 330, and the first buffer 320 may be sequentially disposed from the bottom in the third direction Z. The first buffer 320 may be positioned to have a height corresponding to that of a coating module 401 of the coating and development module 400, and the second buffer 330 and the cooling chamber 340 may be provided to have a height corresponding to that of a development module 402 of the coating and development module 400.

Each of the first buffer 320 and the second buffer 330 may temporarily store a plurality of substrates W. The first buffer 320 may include a housing 321 and a plurality of supports 322. In the first buffer 320, the supports 322 may be disposed in the housing 321, and may be spaced apart from each other in the third direction Z. The second buffer 330 may include a housing 331 and a plurality of supports 332. In the second buffer 330, the supports 332 may be disposed in the housing 331 and may be spaced apart from each other in the third direction Z. One substrate W may be disposed on each support 322 of the first buffer 320 and each support 332 of the second buffer 330. The housing 331 may have an opening in a direction in which the transfer portion 220 is provided, such that the transfer portion 220 may carry the substrate W into or out of the support 332 in the housing 331.

The first buffer 320 may have a structure substantially similar to that of the second buffer 330. However, the housing 321 of the first buffer 320 may have openings in a direction in which a first buffer robot 360 is provided and in a direction in which a coating portion robot 421 positioned in the coating module 401 is provided. The number of supports 322 provided in the first buffer 320 may be the same or different from the number of supports 332 provided in the second buffer 330. According to an example, the number of supports 332 provided in the second buffer 330 may be greater than the number of supports 322 provided in the first buffer 320.

The cooling chamber 340 may cool the substrate W. The cooling chamber 340 may include a housing 341 and a cooling plate 342. The cooling plate 342 may have an upper surface on which the substrate W is disposed, and a cooling means 343 for cooling the substrate W. Various methods, such as cooling using coolant or cooling using a thermoelectric element, may be used as the cooling means 343. In addition, the cooling chamber 340 may include a lift pin assembly for positioning the substrate W on the cooling plate 342. The housing 341 may have openings in a direction in which the transfer portion 220 is provided and in a direction in which a development portion robot, provided in the development module 402, is provided, such that a transfer robot 220 and the development portion robot may carry the substrate W into or out of the cooling plate 342. In addition, doors for opening and closing the above-described openings may be provided in the cooling chamber 340.

In the above-described example embodiments, the buffer module 300 has been described to include the cooling chamber 340, but the present disclosure is not limited thereto, and the cooling chamber 340 may be omitted, as necessary.

The coating module 401 may include a process of coating a photosensitive liquid such as a photoresist on the substrate W, and a heat treatment process, such as heating and cooling of the substrate W, before and after a resist coating process. The coating module 401 may have a coating chamber 410 and a conveyance chamber 420.

For example, the coating chamber 410, the conveyance chamber 420, and the heat treatment chamber portion 500 may be sequentially disposed in the second direction X. That is, with respect to the conveyance chamber 420, the coating chamber 410 may be disposed on one side of the conveyance chamber 420, and the heat treatment chamber portion 500 may be disposed on the other side of the conveyance chamber 420. However, the present disclosure is not limited thereto.

A plurality of coating chambers 410 may be provided in the third direction Z. In addition, as illustrated in FIG. 1, a plurality of coating chambers 410 may be provided, or one coating member 410 may be provided in the first direction Y.

The heat treatment chamber portion 500 may include a baking chamber 510 and a cooling chamber 520, and a plurality of baking chambers 510 and a plurality of cooling chambers 520 may be provided in the third direction Z. The conveyance chamber 420 may be positioned in parallel to the first buffer 320 of the first buffer module 300 in a first direction 12. The coating portion robot 421 and the guide rail 422 may be positioned in the conveyance chamber 420. The conveyance chamber 420 may have a substantially rectangular shape. The coating portion robot 421 may transfer the substrate W, between the baking chamber 510, the cooling chamber 520, the coating chamber 410, and the first buffer 320 of the first buffer module 300.

The guide rail 422 may be disposed such that a length direction thereof is parallel to the first direction Y. The guide rail 422 may guide the coating portion robot 421 to linearly move in the first direction Y. The coating portion robot 421 may have a hand 423, an arm 424, a support 425, and a pedestal 426. The hand 423 may be fixedly installed on the arm 424. The arm 424 may have a stretchable structure, such that the hand 423 may move in a horizontal direction. The support 425 may be disposed such that a length direction thereof is the same as the third direction Z. The arm 424 may be coupled to the support 425 so as to be linearly movable in the third direction Z along the support 425. The support 425 may be fixedly coupled to the pedestal 426, and the pedestal 426 may be coupled to the guide rail 422 so as to be movable along the guide rail 422.

All of the coating chambers 410 may have the same structure. However, types of treatment liquids used in the coating chambers 410 may be different from each other. A treatment liquid for forming a photoresist film or an antireflection film may be used as the treatment liquids.

The coating chamber 410 may coat a treatment liquid on the substrate W. A treatment unit, including a treatment container 411, a support portion 412, and a nozzle portion 413, may be provided in the coating chamber 410.

For example, one treatment unit may be disposed in each coating chamber 410 in the first direction Y, but the present disclosure is not limited thereto, and two or more treatment units may be disposed in one coating chamber 410. The treatment units may all have the same structure. However, types of treatment liquids used in the treatment units may be different from each other.

The treatment container 411 of the coating chamber 410 may have a shape having an open upper portion. The support portion 412 may be disposed in the treatment container 411, and may support the substrate W. The support portion 412 may be rotatably provided. The nozzle portion 413 may supply a treatment liquid onto the substrate W disposed on the support portion 412. The treatment liquid may be coated on the substrate W in a spin-coating manner.

In addition, the coating chamber 410 may further selectively include a nozzle (not illustrated) supplying a cleaning liquid such as deionized water (DIW) to clean a surface of the substrate W on which a treatment liquid is coated, and a back rinse nozzle (not illustrated) for cleaning a lower surface of the substrate W.

In the baking chamber 510, when the substrate W is mounted by the coating portion robot 421, the substrate W may be heat-treated. In the baking chamber 510, a pre-bake process of removing organic matter or moisture from a surface of the substrate W by heating the substrate W to a predetermined temperature may be performed before a treatment liquid is coated, or a soft bake process may be performed after a treatment liquid coated on a wafer W, and a cooling process of cooling the substrate W may be performed after each heating process.

A heating plate 511 and a heating means 511*a* may be provided in the baking chamber 510. The heating means 511*a* may heat the substrate W disposed in the baking chamber 510. In this case, the substrate W may be heated in a state in which the baking chamber 510 is sealed, and the heating means 511*a* may heat the entire region of the substrate W to a uniform temperature. Such a heat treatment process may stabilize a liquid film by blowing organic matter on the liquid film formed by coating the treatment liquid to the substrate W. Various methods, such as a heating method using a heating wire provided on the inside or outside of the heating plate 511 or a heating method using a heater disposed the inside or outside of the baking chamber 510, may be used as the heating means 511*a*.

In addition, the baking chamber 510 may further include a cooling plate 512. The cooling plate may receive coolant from a cooling unit 910 to be described below to cool the substrate W, thereby preventing the substrate W from being heated to an excessively high temperature by the heat treatment process. After the heat treatment process is completed, the substrate W may be transferred to the cooling chamber 520.

The cooling chamber 520 may perform a cooling process of cooling the substrate W before a treatment liquid is coated. The cooling chamber 520 may include a cooling plate. The cooling plate may include a cooling means in which various methods, such as cooling using a coolant or cooling using a thermoelectric element, are used to cool the substrate W.

The interface module 600 may connect the coating and development module 400 to an external exposure device 800. The interface module 600 may include an interface frame 610, a first interface buffer 620, a second interface buffer 630, and a conveyance robot 640, and the conveyance robot 640 may convey, to the exposure device 800, the substrate conveyed to the first and second interface buffers 620 and 630 after the coating and development module 400 is terminated. The first and second interface buffers 620 may include a housing 621 and a support 622, and the conveyance robot 640 and the coating portion robot 421 may carry the substrate W into/out of the support 622.

Figure 4A:
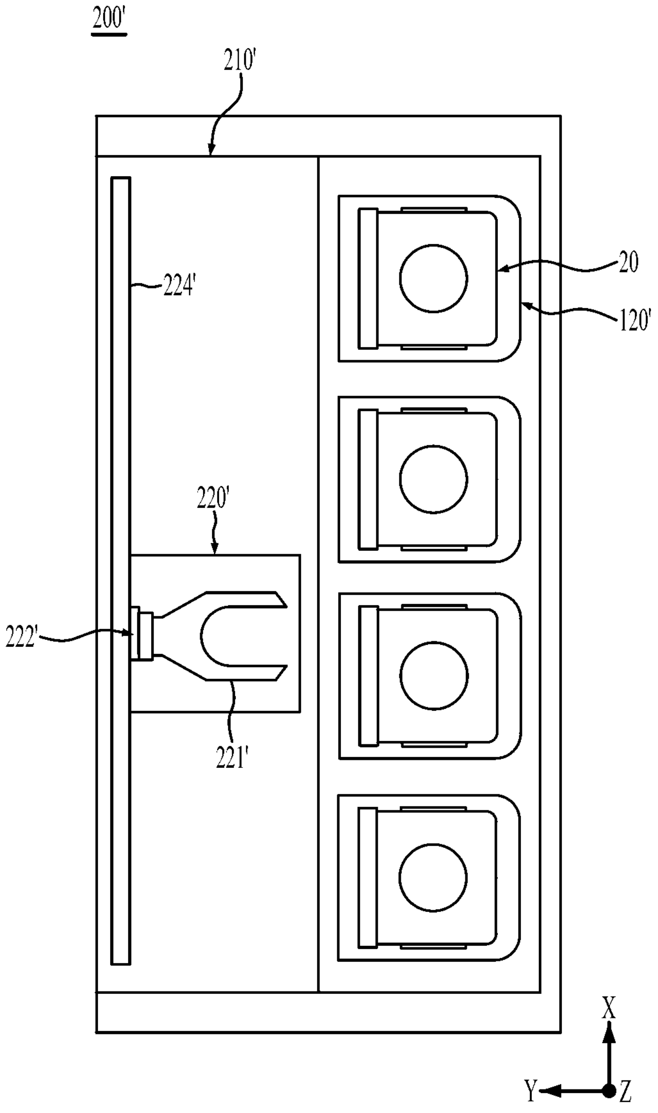
FIG. 4A is a top view of a storage and transfer module included in a substrate treatment apparatus according to the related art.
Figure 4B:
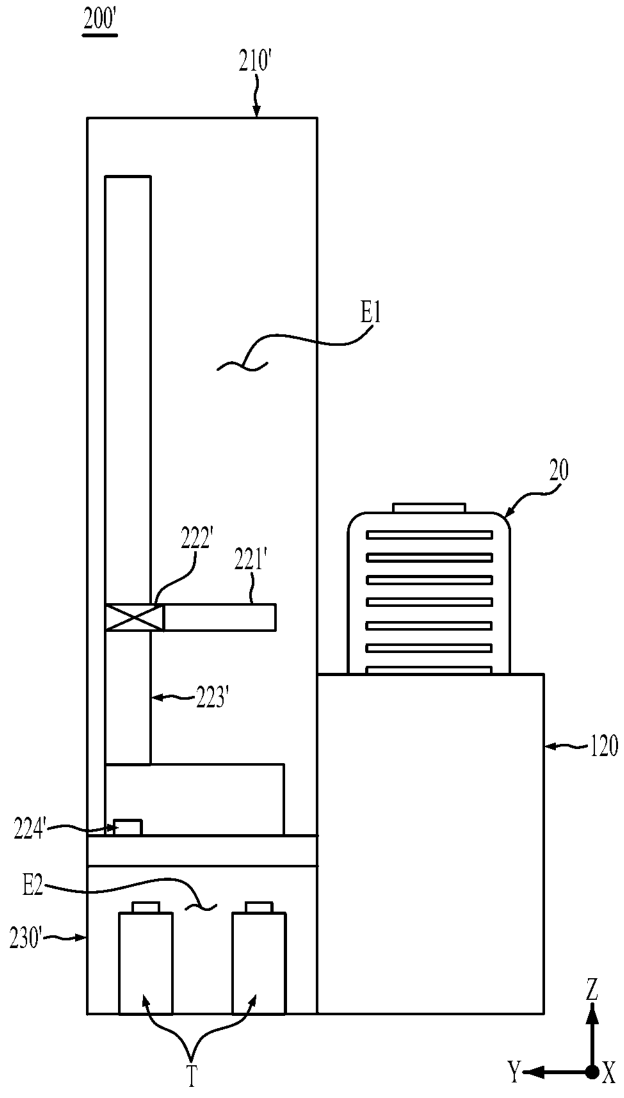
FIG. 4B is a side view of the storage and transfer module of FIG. 4A.

FIG. 4A is a top view of a storage and transfer module included in a substrate treatment apparatus according to the related art, and FIG. 4B is a side view of the storage and transfer module of FIG. 4A.

Referring to FIGS. 4A and 4B, a storage and transfer module 200', included in the substrate treatment apparatus according to the related art, may include a module body 210', a transfer portion 220', and a storage portion 230'. The module body 210' may be a structure formed by connecting a plurality of frames, and may have an internal empty space having an upper region E1 and a lower region E2, partitioned from each other.

In the storage and transfer module 200' according to the related art, the transfer portion 220' may be disposed in the internal upper region E1 of the module body 210'. In this case, a guide rail 224' may be disposed on a bottom surface of the upper region E1. A support portion 223' may be disposed on the guide rail 224', such that the support portion 223' may reciprocate in a first direction X. A transfer robot 221', handling a substrate W of the transfer portion 220', may be coupled to the support portion 223' through a connection portion 222'. In addition, about four cassettes 20 in which the substrate W is accommodated and about four mountable tables 120' supporting the same may be generally arranged on one side of the transfer portion 220' in the first direction X. In such an arrangement state, the transfer robot 221' may transfer the cassette 20 on the mounting table 120' to a buffer module (not illustrated) while reciprocating in the first direction X in the upper region E1.

In addition, a treatment liquid container T, containing a treatment liquid used in a process of treating the substrate W, may be stored in the lower region E2 of the internal empty space of the module body 210'. The lower region E2 of the internal empty space of the module body 210' corresponds to a remaining region excluding a space required for installation of the transfer robot 221' and the mounting table 120', and may be used to store the treatment liquid container T. In addition, an arrangement interval between facilities may be limited due to a large number of facilities installed in a semiconductor line, such that the lower region E2 of the empty space may inevitably have a narrow size. As a result, there is a limitation in that a large number of treatment liquid containers T may not be stored at once.

Figure 5:
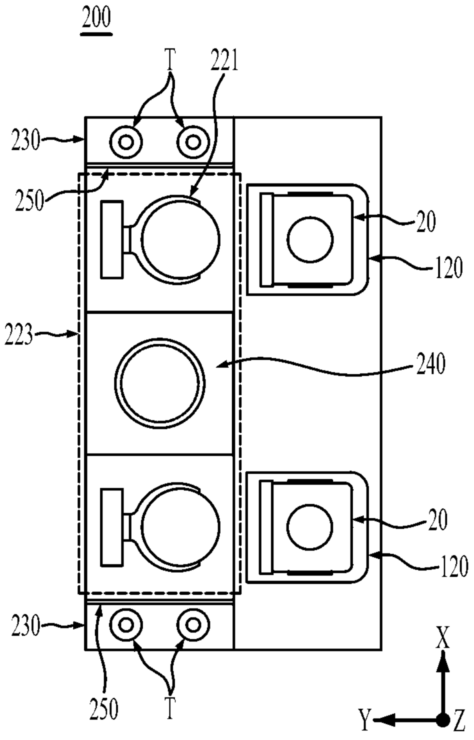
FIG. 5 is a top view of a storage and transfer module according to an example embodiment of the present disclosure.
Figure 6:
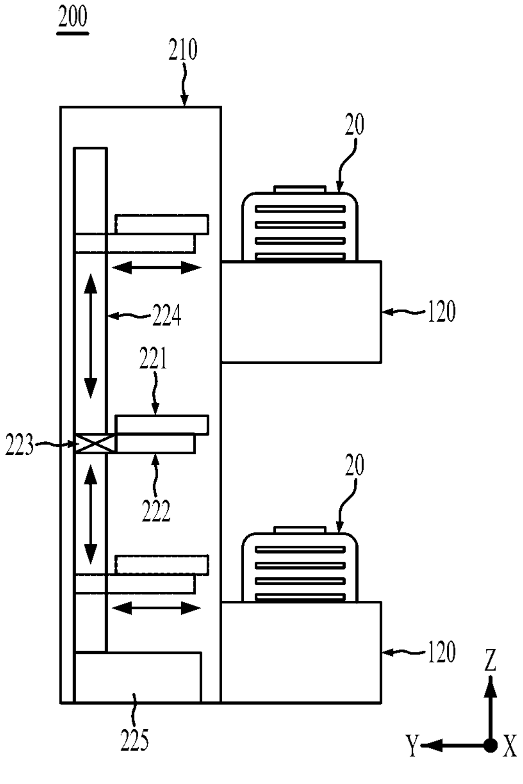
FIG. 6 is a schematic view of the storage and transfer module of FIG. 1 in a direction of A1-A1 of FIG. 1.
Figure 7:
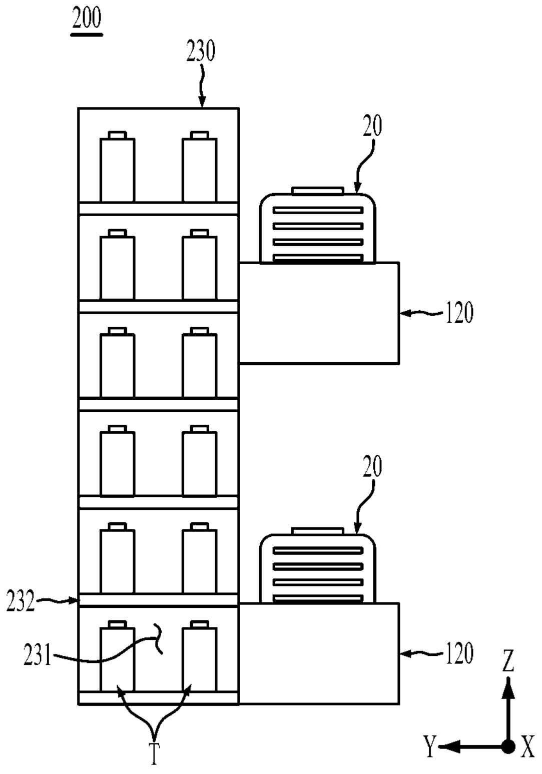
FIG. 7 is a schematic view of the storage and transfer module of FIG. 1 in a direction of A2-A2 of FIG. 1.
Figure 8:
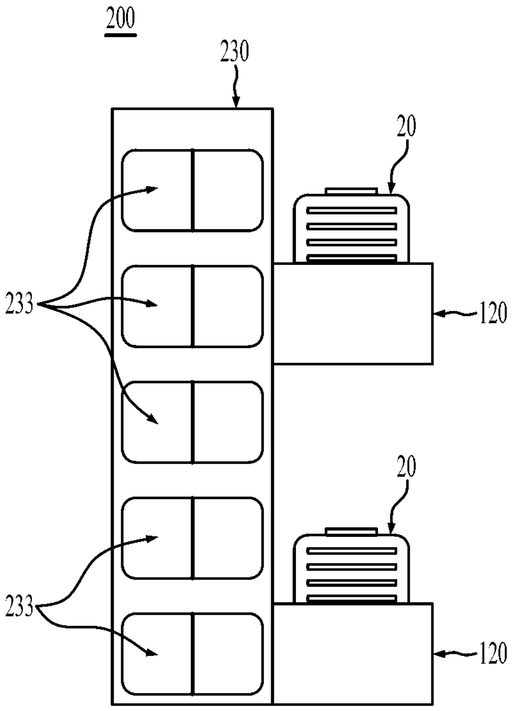
FIG. 8 is a schematic view of the storage and transfer module of FIG. 1 in a direction of A3-A3 of FIG. 1.

FIG. 5 is a top view of a storage and transfer module according to an example embodiment of the present disclosure. FIG. 6 is a schematic view of the storage and transfer module of FIG. 5 in a direction of A1-A1 of FIG. 1. FIG. 7 is a schematic view of the storage and transfer module of FIG. 5 in a direction of A2-A2 of FIG. 1. FIG. 8 is a schematic view of the storage and transfer module of FIG. 5 in a direction of A3-A3 of FIG. 1.

Referring to FIGS. 5 to 8, a storage and transfer module 200 according to an example embodiment (Example 1) of the present disclosure may include a storage and transfer unit U including a transfer portion 220 and a storage portion 230, and a transfer target portion 240, as described above. Specific features of the transfer portion 220 may be the same as described above, and the storage portion 230 and the transfer target portion 240 will be described below.

The storage portion 230 may be a housing having a storage space 231 therein. The storage portion 230 may have various shapes. For example, the storage portion 230 may have a rectangular parallelepiped shape having a storage space 231 therein. In this case, the storage portion 230 may have a width (a length in a second direction Y), the same as or similar to that of the module body 210.

The storage portion 230 may include at least one support plate 232. For example, the storage portion 230 may include a plurality of support plates 232. In this case, a plurality of support plates 232 may be disposed in the storage space 231. In this case, the support plates 232 may be spaced apart from each other at a predetermined interval in a height direction of the storage portion 230, that is, a third direction Z. As a result, the storage space 231 may be partitioned into multiple partitioned regions. As the plurality of support plates 232 are disposed in the storage space 231 to have a multistage accommodation structure in the third direction Z, treatment liquid containers T may be stored on each support plate 232 in a stacked manner. Adjacent support plates 232 may have the same or similar interval therebetween. Such an interval may be formed to be greater than a size of the treatment liquid container T.

In addition, the storage portion 230 may further include an opening/closing portion 233. The opening/closing portion 233 may be disposed on an outer surface of the storage portion 230. As illustrated in the drawings, the opening/closing portion 233 may be a door coupled to the storage portion 230 using an opening/closing member (not illustrated) such as a hinge. However, the present disclosure is not limited thereto, and the opening/closing portion 233 may be a door that is opened and closed using various methods such as sliding or a detachment. Opening and closing of the opening/closing portion 233 may allow the storage space 231 of the storage portion 230 to selectively communicate with the outside. Accordingly, after the opening/closing portion 233 is opened, the treatment liquid container T may be accommodated in the storage space 231 or discharged from the storage space 231.

At least one opening/closing portion 233 may be provided. For example, a plurality of opening/closing portions 233 may be provided. In this case, the number of the plurality of opening/closing portions 233 may be the same as the number of the plurality of support plates 232. In this case, the plurality of opening/closing portions 233 may be disposed at positions opposing the support plates 232, respectively. Accordingly, when a treatment liquid container T accommodated in a support plate 232, among a plurality of support plates 232, is stored or discharged, an opening/closing portion 233, opposing the support plate 232, may be opened or closed.

For another example, one opening/closing portion may be provided. In this case, the opening/closing portion 233 may extend from a lower end to an upper end of the storage portion 230. In this case, when a treatment liquid container T is discharged or a new treatment liquid container T is accommodated, a single opening/closing portion 233 may be opened regardless of a position of a support plate 232. A plurality of opening/closing portions 233 are provided, and the number of plurality of opening/closing portions may be less than the number of support plates 232, such that one opening/closing portion 233 may open and close two or more support plates 232 and a surrounding storage space 231 thereof.

The transfer target portion 240 may be a region in which the substrate W is transferred by the transfer portion 220. Other modules, included in the substrate treatment apparatus 1, may be disposed on the transfer target portion 240. More specifically, some modules, among various types of modules included in the substrate treatment apparatus 1, may be selectively disposed on the transfer target portion 240, as necessary. For example, in the storage and transfer module 200 according to Example 1 of the present disclosure, as illustrated in the drawings, a buffer module 300 may be disposed on the transfer target portion 240.

The storage and transfer unit U and the transfer target portion 240 may be disposed in an internal space of the module body 210. A plurality of storage and transfer units U may be provided. For example, the storage and transfer module 200 may include a pair of storage and transfer units U. In this case, the pair of storage and transfer units U may be spaced apart from each other. In this case, the transfer target portion 240 may be disposed between the pair of storage and transfer units U. Accordingly, the pair of storage and transfer units U may oppose each other with the transfer target portion 240 interposed therebetween.

The storage portion 230 may be disposed on one side of the transfer portion 220. Here, the one side of the transfer portion 220 may refer to an opposite side of the transfer target portion 240, among two sides of the transfer portion 220, with respect to a first direction X. Accordingly, the storage portion 230 may be disposed at an outermost end of the module body 210 in a longitudinal direction (first direction) X. In addition, as described above, as the pair of storage and transfer units U are provided, the storage portion 230 may be disposed at each of opposite outermost ends of the module body 210. Accordingly, the module body 210 may include the storage portion 230, the transfer portion 220, the transfer target portion 240, the transfer portion 220, and the storage portion 230, sequentially disposed in the first direction X.

In addition, a partition wall 250 may be provided between the transfer portion 220 and the storage portion 230. The partition wall 250 may be in the form of a plate extending in parallel to a second direction Y while extending from a lower end of the storage portion 230 to an upper end of the storage portion 230 in a third direction Z, within the module body 210. The transfer portion 220 and the storage portion 230 may be disposed in regions that are completely partitioned from each other by the partition wall 250, thereby preventing damage caused by touching a treatment liquid container T stored in the storage portion 230 while the transfer portion 220 transfers the substrate W.

As described above, a substrate loading portion may include a plurality of mounting tables 120. The plurality of mounting tables 120 may be disposed on one side of the module body 210. More specifically, the mounting table 120 may be disposed in front of the transfer portion 220 (−Y direction in the drawings), with respect to the second direction Y. In this case, the plurality of mounting tables 120 may form at least two rows (hereinafter referred to as "mountain table rows") arranged in a row in the third direction Z. The mounting table rows may be formed in a manner in which at least two or more mounting tables 120 are spaced apart from each other in the third direction Z.

The number of the above-described mounting table rows may be the same as the number of transfer portions 220 included in the storage and transfer module 200. When a pair of storage and transfer units U are provided, the plurality of mounting tables 120 may form two rows. In this case, one of the two mounting table rows may be disposed in front of one of a pair of transfer portions 220. In addition, the other one of the two mounting table rows may be disposed in front of the other one of the pair of transfer portions 220.

Accordingly, at least two or more mounting tables 120, arranged to be spaced apart from each other in the third direction Z, may be disposed in front of one transfer portion 220. Two mounting tables 120 are illustrated as being included in one mounting table row, but the present disclosure is not limited thereto.

Although not illustrated in the drawings, in a storage and transfer module 200 according to another example embodiment (Example 2) of the present disclosure, a heat treatment chamber portion 500 may be disposed on a transfer target portion 240. In addition, in a storage and transfer module 200 according to another example embodiment (Example 3) of the present disclosure, an inspection module (not illustrated), inspecting a defective state of a substrate W or the like, may be disposed.

Referring back to FIGS. 5 and 6, a method of conveying, by the storage and transfer module 200, the substrate W may be as follows.

First, the substrate W may be loaded on the mounting table 120 of the substrate loading portion. In this case, the substrate W may be accommodated in the cassette 20. When a plurality of mounting tables 120 are provided, the cassette 20 in which the substrate W is accommodated may be accommodated on each mounting table 120. For another example, even when the substrate W is not accommodated in the cassette 20, the substrate W may be loaded on the mounting table 120.

Subsequently, the transfer portion 220 may transfer the substrate W to the transfer target portion 240. In this case, as illustrated in FIG. 6, the hand portion 221 may be moved along the guide portion 224 by the vertical transfer portion 223. Accordingly, the hand portion 221 may be moved to a position opposing one of at least two mounting tables 120 arranged in the third direction Z. At this position, the hand portion 221 may horizontally move toward the substrate W by the horizontal transfer portion 222 to grip the substrate W.

Subsequently, the substrate W may horizontally move in an opposite direction, return to an original position thereof, and then may rotate in a direction toward the transfer target portion 240. The hand portion 221 may be horizontally moved toward the transfer target portion 240 by the horizontal transfer portion 222, and the substrate W may be transferred onto the substrate support portion included in another module, included in the substrate treatment apparatus 1 disposed in the transfer target portion 240. Here, the other module may be one of the buffer module 300, the heat treatment chamber portion 500, and the substrate inspection module (not illustrated), but the present disclosure is not limited thereto. The module body 210 may include a door opener (not illustrated), and may discharge the substrate W from the cassette 20 before being transferred to the transfer target portion 240. Accordingly, only the substrate W may be transferred to the transfer target portion 240.

Subsequently, the hand portion 221 may return to an original position thereof, may lift along the guide portion 224, and may move toward another mounting table 120, among multiple mounting tables 120 arranged in a row as described above. Thereafter, multiple substrates W may be sequentially transferred to the transfer target portion 240 in the same manner as described above.

In the transfer target portion 240, the transferred substrate W may be temporarily stored and then transferred back to another module, or a heat treatment process or inspection operation for the substrate W may be performed. In addition, when a process of coating a treatment liquid on the substrate W is performed in the coating module 400 or the like, the treatment liquid container T may be carried out from the storage portion 230 and used.

As described above, in the storage and transfer module 200 and the substrate treatment apparatus 1 including the same according to example embodiments of the present disclosure, another module of the substrate treatment apparatus 1, such as the buffer module 300, the substrate inspection module, or the heat treatment chamber 500 may be disposed in the transfer target portion 240, a region between transfer portions 220 opposing each other, thereby optimizing a conveyance path of the substrate W and allowing the substrate treatment apparatus 1 to have a compact structure. In addition, a storage portion 230 having a multistage accommodation structure may be disposed in a height direction Z at opposite outer ends of the transfer portions, opposing each other. As a result, multiple treatment liquid containers T may be stored in a stacked manner to reduce time required to replenish the treatment liquid containers T, thereby improving productivity of the substrate treatment apparatus 1.

While example embodiments have been shown and described above, it will be apparent to those skilled in the art that modifications and variations could be made without departing from the scope of the present disclosure as defined by the appended claims.

What is claimed is:

1. A storage and transfer module comprising:

a module body;

a pair of storage and transfer units disposed in the module body, each of the pair of storage and transfer units including a liftable transfer portion, and a storage portion disposed on the outside of the liftable transfer portion, the storage portion of each of the pair of storage and transfer units having a storage space therein; and a transfer target portion in which a substrate is transferred by the transfer portion, wherein the pair of storage and transfer units are disposed to oppose each other with the transfer target portion interposed therebetween, a substrate loading portion is disposed on one side of each of the pair of storage and transfer units, the pair of storage and transfer units are disposed in a first row in one direction, and the storage portion of each of the pair of storage and transfer units is disposed on an opposite outer side of each of the pair of storage and transfer units to be aligned in the first row with the pair of storage and transfer units, the substrate loading portion includes at least two mounting tables, the at least two mounting tables are disposed to be spaced apart from each other in a second row in the vertical direction, in each of the pair of storage and transfer units, a partition wall is disposed between the liftable transfer portion and the storage portion such that the liftable transfer portion and the storage portion are respectively disposed in spaces that are partitioned and closed off from one other by the partition wall, and an outer wall of each of the storage unit of the pair of storage and transfer unit that is opposite to the partition wall sits flush against an outer-most boundary of a substrate treatment apparatus in which the storage and transfer module is installed along with at least two other modules of the substrate treatment apparatus.

2. The storage and transfer module of claim 1, wherein in the storage space of each of the pair of storage and transfer units, a plurality of support plates are disposed in multiple stages in a vertical direction, and at least one of the plurality of treatment liquid containers is supported on each of the support plates.

3. The storage and transfer module of claim 2, wherein the liftable transfer portion of each of the pair of storage and transfer units comprises:

a guide portion extending in the vertical direction, a vertical transfer portion slidably connected to the guide portion, and a hand portion that is rotatable and capable of selectively gripping the substrate.

4. The storage and transfer module of claim 3, wherein the liftable transfer portion in each of the pair of storage and transfer units is disposed between the hand portion and the vertical transfer portion, and further comprises a horizontal transfer portion, linearly moving the hand portion toward the transfer target portion or the substrate loading portion.

5. The storage and transfer module of claim 3, wherein the plurality of support plates of each of the pair of storage and transfer units are disposed to be spaced apart from each other at a regular interval from a lower end of the guide portion to an upper end of the guide portion.

6. The storage and transfer module of claim 1, wherein, one of a buffer module in which the substrate is stored, a heat treatment chamber portion heating or cooling the substrate, and an inspection module inspecting a state of the substrate is disposed in the transfer target portion.

7. The storage and transfer module of claim 1, wherein, for each of the pair of storage and transfer units:

a plurality of treatment liquid containers are stored in a stationary manner in the storage portion, the storage portion comprises a plurality of opening/closing portions on the outer wall of the storage portion, and a location of each of the plurality of opening/closing portions on the outer wall corresponds to a location at which each of the plurality of treatment liquid containers are stored in the stationary manner within the storage portion.

8. A substrate treatment apparatus comprising:

a loading port including a substrate loading portion in which a substrate is disposed;

a buffer module including a frame and a plurality of buffers disposed in the frame, the plurality of buffers arranged in a vertical direction; and a storage and transfer module that comprises:

a module body, a pair of storage and transfer units disposed in the module body, each of the pair of storage and transfer units including a liftable transfer portion, and a storage portion disposed on the outside of the liftable transfer portion, the storage portion of each of the pair of storage and transfer units having a storage space therein, and a transfer target portion in which a substrate is transferred by the transfer portion, wherein the pair of storage and transfer units are disposed to oppose each other with the transfer target portion interposed therebetween, the substrate loading portion is disposed on one side of each of the pair of storage and transfer units the pair of storage and transfer units are disposed in a first row in one direction, and the storage portion of each of the pair of storage and transfer units is disposed on an opposite outer side of each of the pair of storage and transfer units to be aligned in the first row with the pair of storage and transfer units, the substrate loading portion includes at least two mounting tables, the at least two mounting tables are disposed to be spaced apart from each other in a second row in the vertical direction, in each of the pair of storage and transfer units, a partition wall is disposed between the liftable transfer portion and the storage portion such that the liftable transfer portion and the storage portion are respectively disposed in spaces that are partitioned and closed off from one other by the partition wall, and an outer wall of each of the storage unit of the pair of storage and transfer unit that is opposite to the partition wall sits flush against an outer-most boundary of a substrate treatment apparatus in which the storage and transfer module is installed along with at least two other modules of the substrate treatment apparatus.

9. The substrate treatment apparatus of claim 8, wherein in the storage space of each of the pair of storage and transfer units, a plurality of support plates are disposed in multiple stages in a vertical direction, and at least one treatment liquid container is supported on each of the support plates.

10. The substrate treatment apparatus of claim 9, wherein the liftable transfer portion of each of the pair of storage and transfer units comprises:

a guide portion extending in the vertical direction, a vertical transfer portion slidably connected to the guide portion, and a hand portion that is rotatable and capable of selectively gripping the substrate.

11. The substrate treatment apparatus of claim 10, wherein the plurality of support plates of each of the pair of storage and transfer units are disposed to be spaced apart from each other at a regular interval from a lower end of the guide portion to an upper end of the guide portion.

12. The substrate treatment apparatus of claim 8, further comprising:

a heat treatment chamber portion heating or cooling the substrate; and a substrate inspection module inspecting a defective state of the substrate, wherein one of the buffer module, the heat treatment chamber portion, and the substrate inspection module is disposed in the transfer target portion.

13. A substrate treatment apparatus comprising:

a loading port including a cassette in which a substrate is accommodated, and a plurality of mounting tables on which the cassette is loaded;

a heat treatment chamber portion including a baking chamber and a plurality of heating plates disposed in the baking chamber, the plurality of heating plates stacked in a vertical direction;

a buffer module including a frame and a plurality of buffers disposed in the frame, the plurality of buffers arranged in the vertical direction; and a storage and transfer module that comprises:

a module body, a pair of storage and transfer units disposed in the module body, each of the pair of storage and transfer units including a liftable transfer portion, and a storage portion disposed on the outside of the liftable transfer portion, the storage portion of each of the pair of storage and transfer units having a storage space therein, and a transfer target portion in which a substrate is transferred by the transfer portion, wherein the pair of storage and transfer units are disposed to oppose each other with the transfer target portion interposed therebetween, one of the plurality of mounting tables is disposed on one side of each of the pair of storage and transfer units such that each of the plurality of mounting tables respectively oppose each of the pair of storage and transfer units, the plurality of mounting tables are disposed in a row in the vertical direction, in the storage space of each of the pair of storage and transfer units, a plurality of support plates are disposed in multiple stages in the vertical direction and at least one treatment liquid container is supported on each of the support plates, one of the buffer module and the heat treatment chamber portion is selectively disposed in the transfer target portion in each of the pair of storage and transfer units, a partition wall is disposed between the liftable transfer portion and the storage portion such that the liftable transfer portion and the storage portion are respectively disposed in spaces that are partitioned and closed off from one other by the partition wall, and an outer wall of each of the storage unit of the pair of storage and transfer unit that is opposite to the partition wall sits flush against an outer-most boundary of a substrate treatment apparatus in which the storage and transfer module is installed along with at least two other modules of the substrate treatment apparatus.

* * * * *